United States Patent
Hong (10) Patent No.: US 9,001,576 B2
(45) Date of Patent: Apr. 7, 2015

(54) SEMICONDUCTOR MEMORY DEVICE AND METHOD OF OPERATING THE SAME

(71) Applicant: SK hynix Inc., Gyeonggi-do (KR)

(72) Inventor: Chong A Hong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/972,108

(22) Filed: Aug. 21, 2013

(65) Prior Publication Data

US 2014/0347922 A1 Nov. 27, 2014

(30) Foreign Application Priority Data

May 22, 2013 (KR) .................... 10-2013-0057771

(51) Int. Cl.
*G11C 16/04* (2006.01)
*G11C 16/34* (2006.01)

(52) U.S. Cl.
CPC .................................. *G11C 16/3427* (2013.01)

(58) Field of Classification Search
CPC .. G11C 29/025; G11C 11/5628; G11C 16/10; G11C 16/349; G11C 29/52; G11C 29/70; G11C 29/702; G11C 16/12

USPC ............ 365/185.02, 185.09, 185.19, 185.21, 365/185.11, 189.011, 189.05
See application file for complete search history.

(56) References Cited

U.S. PATENT DOCUMENTS

2009/0154242 A1 * 6/2009 Janai ........................ 365/185.09

FOREIGN PATENT DOCUMENTS

KR 100938093 1/2010

* cited by examiner

*Primary Examiner* — Thong Q Le
(74) *Attorney, Agent, or Firm* — IP & T Group LLP (57) ABSTRACT

A method of operating a semiconductor memory device includes checking an erase-program cycling number, setting a target erase level to be maintained when the erase-program cycling number is less than a predetermined critical number, and setting the target erase level to be increased when the erase-program cycling number is greater than or equal to the predetermined critical number, and performing an erase operation so that threshold voltages of selected memory cells are less than the set target erase level.

13 Claims, 6 Drawing Sheets

SEMICONDUCTOR MEMORY DEVICE AND METHOD OF OPERATING THE SAME

CROSS-REFERENCE TO RELATED APPLICATION

The present application claims priority of to Korean patent application number 10-2013-0057771, filed on May 22, 2013, the entire disclosure of which is incorporated herein by reference in its entirety.

BACKGROUND

1. Field of Invention

Various embodiments of the present invention relate to a semiconductor design technology and, more particularly, to an erase operation of a semiconductor device.

2. Description of Related Art

A semiconductor memory device, for example, a NAND flash memory, includes a memory cell array in which data are stored. The memory cell array includes a plurality of cell blocks. When program, erase and read operations are performed, a cell block may be selected from among the plurality of cell blocks included in the memory cell array, and corresponding operations may be performed on the selected cell block.

During an erase operation, 0V may be applied to word lines coupled to memory cells within a selected cell block, or the word lines may be floated while an erase voltage may be applied to a bulk of the selected cell block. The bulk is a region where a well within a substrate including the cell blocks is formed.

Recently, an erase operation is performed using an incremental step pulse erase (ISPE) method to reduce width of threshold voltage distributions of memory cells being erased. An erase operation using the ISPE method may be performed by repeating a plurality of erase loops.

An erase loop may include an operation of reducing threshold voltages of memory cells by applying an erase voltage to a bulk and an erase verify operation being carried out as to whether or not the threshold voltages of the memory cells in a selected cell block are reduced to a target level. During the erase verify operation, the target level may be determined depending on an erase verify voltage being applied to all of word lines coupled to the selected cell block. In general, in terms of the erase verify voltage, a voltage having a fixed level may be used.

As a result of the erase verify operation, if it is determined that there are memory cells having threshold voltages not reduced to the target level, the erase loop may be repeated until the threshold voltages of all the memory cells in the selected cell block are reduced to the target level while the erase voltage being applied to the bulk is gradually increased. The erase operation is completed when the threshold voltages of all of the memory cells in the selected cell block are reduced to the target level.

However, as an erase-program cycling number increases, the semiconductor memory device may be physically degraded due to physical properties thereof, and electrical characteristics of the semiconductor memory device may also be degraded. The erase-program cycling number refers to how many times a pair of a program operation and an erase operation is performed. In other words, a single set of program and erase operations may refer to a single erase-program cycling. As the erase-program cycling number increases, erase disturbance of memory cells may be more likely to occur. As a result, it may be more difficult to reduce threshold voltages of the memory cells to a target erase level during an erase operation, and an erase voltage with a higher voltage level may be required to reduce the threshold voltages of the memory cells to the target erase level. In addition, as the time taken to reduce the threshold voltages to the target erase level increases, stress on the semiconductor memory device may also increase.

BRIEF SUMMARY

Exemplary embodiments of the present invention relate to a semiconductor memory device that may prevent an over-erase operation due to erase disturbance and a method of operating the same.

A method of operating a semiconductor memory device according to an embodiment of the present invention may include checking an erase-program cycling number, setting a target erase level to be maintained when the erase-program cycling number is less than a predetermined critical number, and setting the target erase level to be increased when the erase-program cycling number is greater than or equal to the predetermined critical number and performing an erase operation so that threshold voltages of selected memory cells are less than the set target erase level.

A method of operating a semiconductor memory device according to an embodiment of the present invention may include checking an erase-program cycling number, setting a target erase level to be maintained when the erase-program cycling number is less than a first predetermined critical number, setting the target erase level to be increased by a first level when the erase-program cycling number is between the first predetermined critical number and a second predetermined critical number that is greater than the first predetermined critical number, and setting the target erase level to be increased by a second level that is higher than the first level when the erase-program cycling number is greater than the second predetermined critical number, and performing an erase operation so that threshold voltages of selected memory cells are less than the set target erase level.

A semiconductor memory device according to an embodiment of the present invention may include a memory cell array including a plurality of cell blocks storing normal data and at least one spare block storing data corresponding to an erase-program cycling number, and a peripheral circuit suitable for, when an erase operation is performed on a selected cell block among the cell blocks, setting a target erase level for the erase operation to be maintained before the erase-program cycling number reaches a predetermined critical number or to be increased after the erase-program cycling number reaches the predetermined critical number, and for performing the erase operation so that threshold voltages of memory cells within the selected cell block reach the set target erase level.

DESCRIPTION OF EMBODIMENTS

Hereinafter, various embodiments of the present invention will be described in detail with reference to the accompanying drawings. The figures are provided to enable those of ordinary skill in the art to make and use the present invention according to the exemplary embodiments of the present invention. Throughout the disclosure, reference numerals correspond directly to the like numbered parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 1:
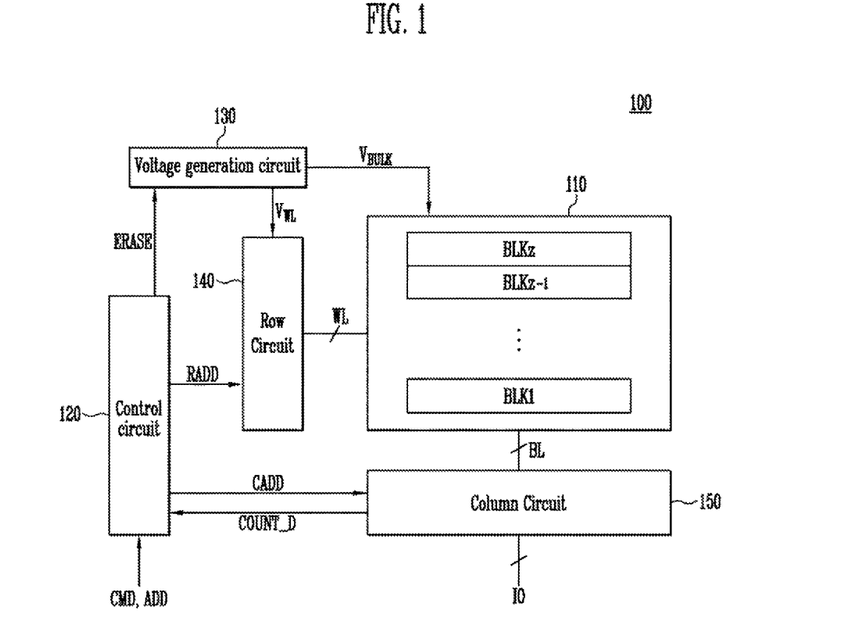
FIG. 1 is a block diagram of a semiconductor memory device according to an embodiment of the present invention.

FIG. 1 is a block diagram of a semiconductor memory device according to the present invention.

Referring to FIG. 1, a semiconductor memory device may include a memory cell array 110 and a plurality of peripheral circuits 120, 130, 140 and 150. Data may be stored in the memory cell array 110. The plurality of peripheral circuits 120, 130, 140 and 150 may be configured to perform program, erase and read operations on the memory cell array 110.

The memory cell array 110 may include a plurality of cell blocks BLK1 to BLKz. The cell blocks BLK1 to BLKz may have substantially the same configurations as each other. At least one of the cell blocks BLK1 to BLKz may function as a spare block. For example, when the first cell block BLK1 is designated as a spare block, data corresponding to an erase-program cycling number for each of the cell blocks may be stored in the spare block BLK1, and normal data may be stored in the other cell blocks BLK2 to BLKz. The erase-program cycling number refers to how many times a pair of a program operation and an erase operation is performed. In other words, a single set of program and erase operations may refer to a single erase-program cycling.

The peripheral circuits 120, 130, 140 and 150 may include a control circuit 120, a voltage generation circuit 130, a row circuit 140 and a column circuit 150.

The control circuit 120 may output various operating signals, a low address RADD and a column address CADD based on a command signal CMD and an address ADD that are externally input.

The voltage generation circuit 130 may generate voltages for respective operations based on the operating signals output from the control circuit 120. For example, when the control circuit 120 outputs an erase operation signal ERASE, the voltage generation circuit 130 may generate an erase voltage $V_{BULK}$ and a verify voltage $V_{WL}$. The erase voltage $V_{BULK}$ may be applied to a bulk BULK (shown in FIG. 2), and the verify voltage $V_{WL}$ may be applied to word lines during an erase verify operation. The bulk BULK may refer to a region where a well of the substrate including the cell blocks is formed.

The row circuit 140 may select a cell block corresponding to the row address RADD and may transfer the voltages, which are output from the voltage generation circuit 130, to word lines WL of the selected cell block. For example, the row circuit 140 may transfer the verify voltage $V_{WL}$, which is output from the voltage generation circuit 130, to the word lines WL of the selected cell block during the erase verify operation.

The column circuit 150 may transfer data, which are externally input, to bit lines BL through input/output lines IO corresponding to the column address CADD or may externally output data, which are read from the memory cell array 110, through the input/output lines IO. In addition, the column circuit 150 may transfer erase-program cycling number information COUNT_D, which is read from the spare block, to the control circuit 120.

The control circuit 120 may compare the erase-program cycling number with a critical number the erase-program cycling number information COUNT_D and may control the voltage generation circuit 130 to change the erase verify voltage $V_{WL}$ according to a result of comparison. The critical number may be arbitrarily predetermined by a user (or a designer).

Figure 2:
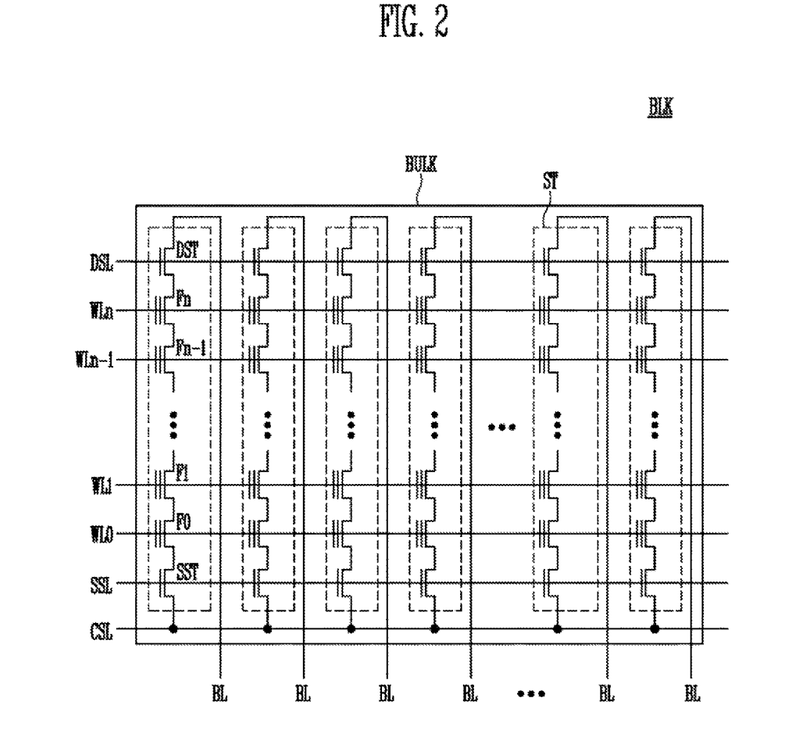
FIG. 2 is a detailed diagram of a cell block included in a memory cell array shown in FIG. 1.

FIG. 2 is a detailed diagram of one of the cell blocks included in the memory cell array 110 shown in FIG. 1. Since the plurality of cell blocks may have substantially the same configurations as each other, one of the cell blocks is described with reference to FIG. 2 as an example.

Referring to FIG. 2, the cell block BLK may include a plurality of cell strings STs that are formed in the bulk BULK. Each of the cell strings STs may include a drain select transistor DST, memory cells F0 to Fn and a source select transistor SST that are coupled in series with each other. A drain of the drain select transistor DST may be coupled to the bit line BL, and a source of the source select transistor SST may be coupled to a common source line CSL. Gates of the drain select transistors DST, which are included in different cell strings STs, may be coupled to a drain selection line DSL. Gates of the memory cells F0 to Fn may be coupled to the word lines WL. Gates of the source select transistors SST may be coupled to a source selection line SSL.

An erase operation of the semiconductor memory device, described in detail with reference to FIGS. 1 and 2, is described below in detail.

Figure 3:
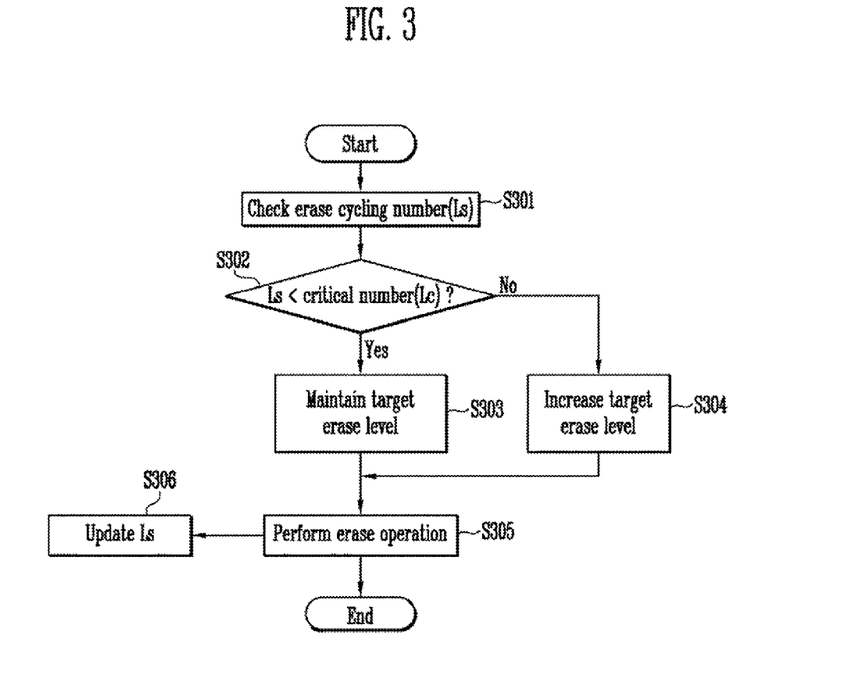
FIG. 3 is a flowchart illustrating an erase operation according to an embodiment of the present invention.

FIG. 3 is a flowchart illustrating an erase operation according to an embodiment of the present invention.

Referring to FIG. 3, when an erase-program cycling number Ls reaches a critical number, a target erase level for an erase verify operation may be increased to prevent an increase of the erase voltage. An erase operation according to an embodiment of the present invention is described below in detail.

When an erase command and an address is input to the semiconductor memory device, the erase-program cycling number Ls for a cell block selected by the address may be checked at step S301. For example, the erase-program cycling number Ls may be checked (or counted) by reading the spare block of the memory cell array 110. Meanwhile, an initial value of the erase-program cycling number Ls may be set to '0,' and the erase-program cycling number Ls may be updated, for example, increased by '1', each time the erase operation is completed.

By comparing the erase-program cycling number Ls with the critical number Lc, it may be determined whether the erase-program cycling number Ls is greater than or less than the predetermined critical number Lc at step S302. The critical number Lc may be arbitrarily predetermined by the user (or designer).

As a result of comparison at step S302, when it is determined that the erase-program cycling number Ls is less than the critical number Lc, the target erase level may be set to be maintained at a predetermined level at step S303. For example, since the target erase level may be controlled by the erase verify voltage $V_{WL}$ of FIG. 1, which is applied to the word lines within the cell block during the erase verify operation, the predetermined erase verify voltage $V_{WL}$ may be set to be maintained.

As a result of comparison at step S302, when it is determined that the erase-program cycling number Ls is greater than or equal to the critical number Lc, the target erase level may be set to be increased more than a predetermined level at step S304. For example, the erase verify voltage $V_{WL}$ may be set to be increased by a verify step level. The erase verify voltage $V_{WL}$, determined at step S303 or S304, may be used during subsequent erase verify operations.

At step S305, an erase operation may be performed using the erase verify voltage $V_{WL}$ determined at step S303' or 'S304.' In other words, since the target erase level is also set by the erase verify voltage $V_{WL}$, the erase operation may be performed so that threshold voltages of memory cells may be less than the set target erase level. The erase operation may be performed using an incremental step pulse erase (ISPE) method by which an erase voltage is gradually increased. An erase operation using the ISPE method may include a plurality of erase loops. Each of the erase loops may include a sub-erase operation and an erase verify operation. During the sub-erase operation, threshold voltages of memory cells, included in the cell block, may be reduced by applying an erase voltage to a bulk including the cell block. During the erase verify operation, it may be determined whether or not the threshold voltages of the memory cells within the cell block are reduced to the target level as a result of the sub-erase operation.

The sub-erase operation may be performed by floating all the word lines WL0 to WLn of FIG. 1, which are coupled to the memory cells of the cell block, or applying the erase voltage $V_{BULK}$ of FIG. 1 to the bulk BULK of FIG. 2 while 0V is applied to the word lines WL0 to WLn.

The erase verify operation may be performed by precharging the bit lines BL coupled to the cell block, and applying the erase verify voltage $V_{WL}$ to all the word lines WL0 to WLn included in the cell block.

The erase verify operation is described below in detail.

The bit lines BL may be precharged, and the erase verify voltage $V_{WL}$, determined at step S303 or S304, may be applied to the word lines WL0 to WLn. When the common source line CSL is grounded, if the drain select transistors DST and the source select transistors SST are turned on, levels of the bit lines BL may be maintained at a precharge level or may be reduced based on threshold voltage levels of the memory cells. For example, when there are memory cells having threshold voltages greater than the target erase level, potentials of bit lines corresponding to these memory cells may not be reduced. When there are memory cells having threshold voltages less than the target erase level, potentials of bit lines corresponding to these memory cells may be reduced. As described above, during the erase verify operation, it may be verified as to whether all of the memory cells, which are included in the selected cell block, are erased or not depending on potentials of bit lines.

When the target erase level increases, memory cells having higher threshold voltages than the memory cells before the target erase level increases may be determined as erased cells. Therefore, an over-erase operation may be prevented from being performed even when all the memory cells, which are included in the selected cell block, are erased.

As a result of performing the erase verify operation, when the memory cells pass the erase operation, the erase operation may be completed. At this time, the erase-program cycling number Ls may be updated at step S306. As a result of performing the erase verify operation, when the memory cells do not pass the erase operation, erase loops may be repeated by gradually increasing the erase voltage until threshold voltages of all the memory cells in the cell block decrease to the target erase level.

Figure 4:
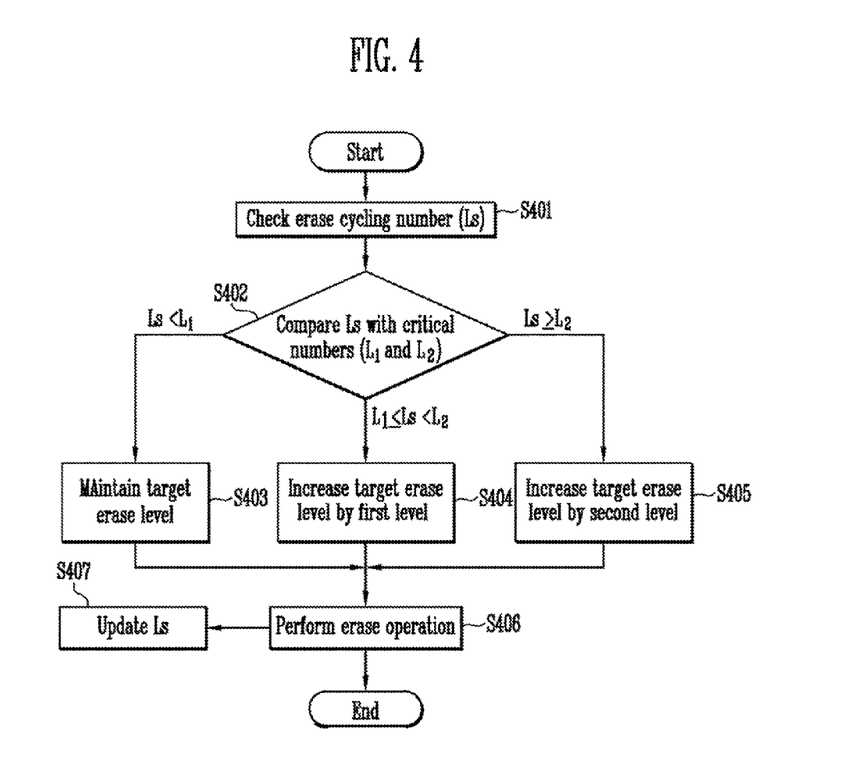
FIG. 4 is a flowchart illustrating an erase operation according to an embodiment of the present invention.

FIG. 4 is a flowchart illustrating an erase operation according to an embodiment of the present invention.

Referring to FIG. 4, the erase-program cycling number Ls may be compared with critical numbers L1 and L2. The critical numbers L1 and L2 may be predetermined by the designer. An increase of an erase voltage may be prevented by controlling a target erase level for an erase verify operation, depending on a section to which the erase-program cycling number Ls belongs. In other words, a plurality of critical numbers may be defined, it may be determined to which critical number section the erase-program cycling number Ls corresponds, and the target erase level may be controlled according to a result of determination. The erase operation according to this embodiment of the present invention is described below.

When an erase command and an address is input to the semiconductor memory device, the erase-program cycling number Ls for the cell block selected by the address may be checked at step S401. For example, the erase-program cycling number Ls may be checked (or counted) by reading the spare block of the memory cell array 110 of FIG. 1.

The erase-program cycling number Ls and the critical numbers L1 and L2 may be compared with each other at step S402. The critical numbers L1 and L2 may be arbitrarily predetermined by a user (or a designer) in consideration of degradation of the semiconductor memory device caused by an increase in the erase-program cycling number. In this embodiment, a description is made in reference to a case in which a first critical number L1 and a second critical number L2 that is greater than the first critical number L1 are defined. For example, the first critical number L1 may be set to 1000, and the second critical number L2 may be set to 2000. The first and second critical numbers may vary depending on semiconductor memory devices. In addition, as the critical number decreases, the target erase level may be controlled more minutely, so that reliability of the erase operation may be increased.

When the erase-program cycling number Ls is less than or equal to the first critical number L1 (Ls≤L1), a small number of erase operations may be performed. As a result, degradation of the semiconductor memory device may be insignificant. In other words, when the erase-program cycling number Ls is less than or equal to the first critical number L1 (Ls≤L1), the target erase level may be set to be maintained at a predetermined level at step S403. For example, since the target erase level may be controlled by the erase verify voltage $V_{WL}$ of FIG. 1, which is applied to the word lines during the erase verify operation, the target erase level may be set to maintain the initially set erase verify voltage $V_{WL}$ at step S403.

When the erase-program cycling number Ls is greater than the first critical number L1 and less than the second critical number L2 (L1<Ls<L2), the target erase level may be increased by a first level from an initially set level at step S404. For example, since the target erase level may be controlled by the erase verify voltage $V_{WL}$ of FIG. 1, which is applied to the word lines during the erase verify operation, the erase verify voltage $V_{WL}$ may be set to be increased by the first level from the initially set erase verify voltage at step S404. For example, when the first level is defined as 0.1V, the erase verify voltage $V_{WL}$ may be set to be increased by 0.1V.

When the erase-program cycling number Ls is greater than or equal to the second critical number L2 (Ls≥L2), the target erase level may be set to a level increased by a second level from the preset level at step S405. The second level may be higher than the first level described above in connection with step S404. In other words, when the erase-program cycling number Ls is greater than or equal to the second critical number L2 (Ls≥L2), the target erase level may be increased by more compared to the increase set at step S404. For example, when the second level is defined as 0.2V, the erase verify voltage $V_{WL}$ may be set to be increased by 0.2V from the initially set level.

At step S406, an erase operation may be performed using the erase verify voltage $V_{WL}$ set at step S403, S404 or S405. The erase operation may be performed using an incremental step pulse erase (ISPE) method by which the erase voltage may be gradually increased. An erase operation using an ISPE method may be performed by repeating a plurality of erase loops. Each of the erase loops may include a sub-erase operation and an erase verify operation. During the sub-erase operation, threshold voltages of memory cells, which are included in a cell block, may be reduced by applying an erase voltage to a bulk including the cell block. During the erase verify operation, it may be verified as to whether the threshold voltages of the memory cells are reduced to the target level as a result of the sub-erase operation.

The sub-erase operation may be performed by floating all word lines WL0 to WLn of FIG. 1, which are coupled to the memory cells of the cell block, or by applying the erase voltage $V_{BULK}$ of FIG. 1 to the bulk BULK of FIG. 2 with 0V applied to the word lines WL0 to WLn.

The erase verify operation may be performed by precharging the bit lines BL, which are coupled to the cell block, and by applying the erase verify voltage $V_{WL}$ set at step S403, S404 or S405 to the word lines WL0 to WLN coupled to the cell block.

The erase verify operation is described below in detail.

The bit lines BL may be precharged, and the erase verify voltage $V_{WL}$ set at step S403, S404 or S405 may be applied to the word lines WL0 to WLN. When the common source line CSL is grounded, if the drain select transistors DST and the source select transistors SST are turned on, levels of the bit lines BL may be maintained at a precharge level or reduced based on threshold voltage levels of the memory cells. For example, when there are memory cells having threshold voltages greater than the target level, potentials of bit lines corresponding to these memory cells may not be reduced. On the other hand, when there are memory cells having threshold voltages less than the target level, potentials of bit lines corresponding to these memory cells may be reduced. Thus, during the erase verify operation, it may be verified as to whether all memory cells, which are included in a selected cell block, are erased or not based on the potentials of bit lines.

When the target erase level increases, memory cells having higher threshold voltages than the memory cells before the target erase level increases may be determined as erased cells. Therefore, an over-erase operation may be prevented from being performed even when all memory cells, which are included in the selected cell block, are erased.

As a result of the erase verify operation, when the memory cells pass the erase operation, the erase operation may be completed. At this time, the erase program cycling number Ls may be updated at step S407. As a result of the erase verify operation, when the memory cells do not pass the erase operation, an erase loop may be repeated by gradually increasing the erase voltage until threshold voltages of all of the memory cells, which are included in the cell block, are reduced to the target erase level.

The erase operation, described according to the above-described embodiments of the present invention, may be quickly completed by increasing the target erase level when the erase-program cycling number increases. Thus, an over erase operation may be suppressed. This erase method is described below using a threshold voltage.

Figure 5:
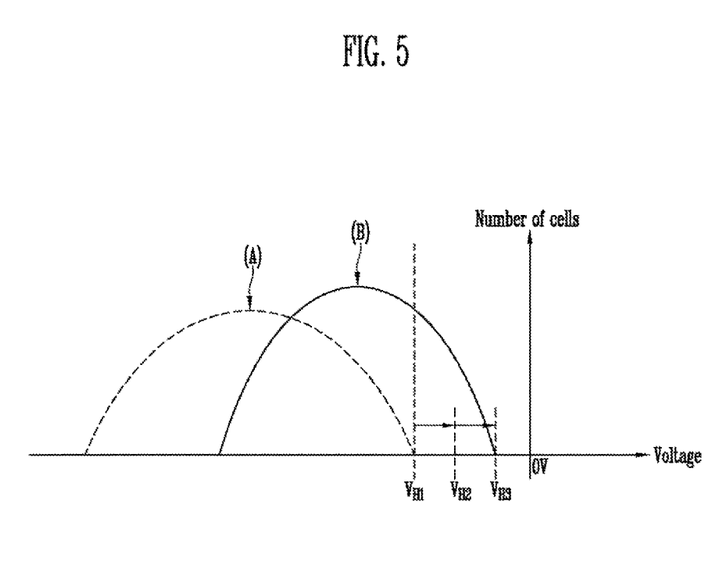
FIG. 5 is graph illustrating threshold voltage distributions of memory cells.

FIG. 5 is a graph illustrating threshold voltage distributions of memory cells.

Referring to FIG. 5, when an erase operation is performed on a selected cell block, an erase voltage having a high voltage level may be applied to the bulk BULK in which the selected cell block is included. As a result, threshold voltages of the memory cells, which are included in the selected cell block, may be reduced. However, as the erase-program cycling number increases, the number of electrons trapped in the memory cells may correspondingly increase. Therefore, it may become increasingly difficult to reduce the threshold voltages of the memory cells during the erase operation. However, in the related art (A), since threshold voltages of memory cells are to be reduced to a predetermined target erase level, the time for an erase operation and a level of the erase voltage may increase.

However, in the above-described embodiment of the present invention (B), when the erases program cycling number increases, the first target erase level $V_{H1}$ of the erase verify operation may gradually increase to the second and third target erase levels $V_{H2}$ and $V_{H3}$. Therefore, the threshold voltages of the memory cells may not be reduced to the initially set first target erase level $V_{H1}$. In other words, after the second target erase level $V_{H2}$ is set by increasing the first target erase level $V_{H1}$ by the first level, the erase operation may be completed when the threshold voltages of the memory cells are reduced to the second target erase level $V_{H2}$. In addition, after the target erase level is increased to the third target erase level $V_{H3}$ by the second level as the erase-program cycling number increases, the erase operation may be completed when the threshold voltages of the memory cells are reduced to the third target erase level $V_{H3}$. However, the erase verify voltage $V_{WL}$ may be controlled so that the target erase level may not exceed 0V.

Figure 6:
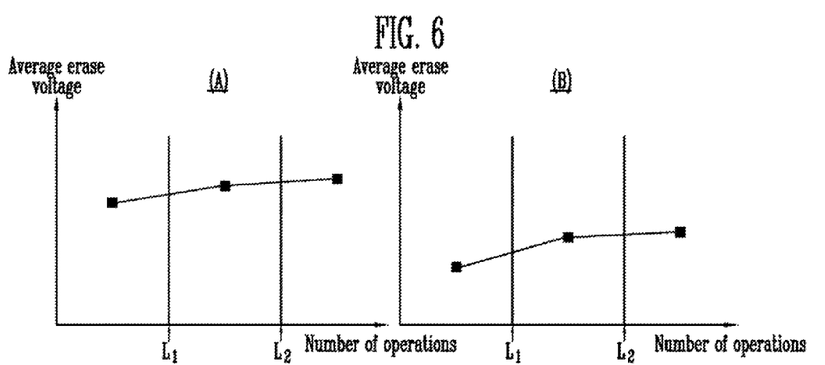
FIG. 6 is a graph illustrating an average erase voltage characteristic according to an erase-program cycling number.
Figure 7:
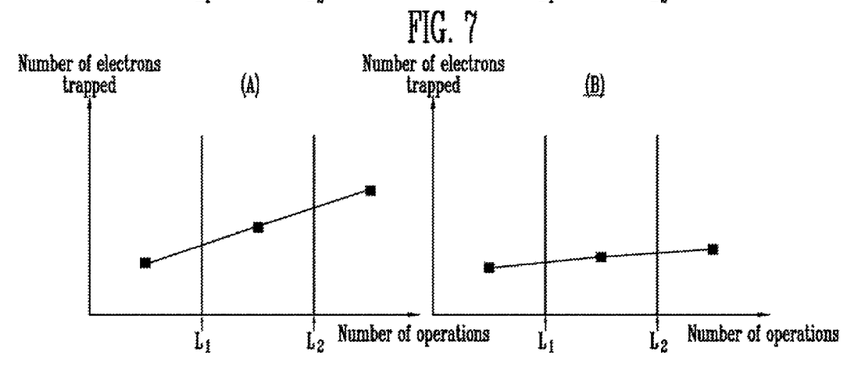
FIG. 7 is a graph illustrating an electron trapping characteristic according to the cycling number.

FIGS. 6 and 7 are graphs for explaining effects of the embodiments of present invention.

FIG. 6 is a graph showing results of comparing average erase voltages of memory cells according to an erase-program cycling number. FIG. 7 is a graph illustrating results of comparing the number of electrons trapped in the memory cells according to the erase-program cycling number.

Referring to FIG. 6, an x-axis denotes an erase-program cycling number, and a y-axis denotes an average erase voltage. In a graph for related art (A), the target erase level may be set to 0V, and in a graph for embodiment of the present invention (B), the target erase level may be set to 1.5V. When the related art graph and the present invention graph are compared against each other, the average erase voltage may increase as the erase-program cycling number increases. However, when the average erase voltages of the related art and the present invention are compared with each other in terms of the same erase-program cycling number, the average erase voltage in the present invention is lower than that in the related art.

In other words, when the target erase level is increased under the same number of operations, the erase voltage may be reduced. When the erase voltage is reduced, stress on the memory cells may be reduced as much. As a result, a defect generation rate of the semiconductor memory device may be reduced, and the lifespan of the semiconductor memory device may be extended.

Referring to FIG. 7, an x-axis denotes an erase-program cycling number, and a y-axis denotes the number of electrons trapped in memory cells. In a graph for related art (A), the target erase level may be set to 0V. In a graph for embodiments of the present invention (B), the target erase level may be set to 1.5V.

When an erase operation is performed, there are ideally no electrons in memory cells. However, in practice, some electrons may be unable to escape and get trapped due to physical properties of the memory cells. For example, some electrons may be trapped in an insulating layer, such as a tunnel insulating layer of a memory cell, and be unable to escape, which may result in erase disturbance. Therefore, as the number of electrons trapped in the memory cell decreases, the erase operation may become easier to perform and reliability may be increased. When the related art and the embodiments of present invention are compared against each other, the number of electrons being trapped may increase as the erase-program cycling number increases. In addition, when the erase-program cycling number is a small number, the number of electrons trapped in the related art may be similar to that of the embodiments of the present invention. However, as the erase-program cycling number increases, a rate at which the number of electrons being trapped increases is lower in the embodiments of the present invention than in the related art.

As described above, when the target erase level for the erase verify operation increases (within a level range in an erase state) as the erase-program cycling number increases, the number of electrons being trapped may be reduced to prevent erase disturbance, and the erase operation may be quickly completed to prevent an increase in the erase voltage.

According to embodiments of the present invention, since a voltage applied to word lines during an erase verify operation is controlled according to an erase-program cycling number, over-erase may be prevented, and the time taken for an erase operation may be reduced. In addition, the number of electrons being trapped in memory cells may also be reduced to prevent erase disturbance.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A method of operating a semiconductor memory device, the method comprising:
    checking an erase-program cycling number;
    setting a target erase level to be maintained when the erase-program cycling number is less than a predetermined critical number, and setting the target erase level to be increased when the erase-program cycling number is greater than or equal to the predetermined critical number; and
    performing an erase operation so that threshold voltages of selected memory cells are less than the set target erase level.

2. The method of claim 1, wherein the target erase level is set to be maintained by maintaining an erase verify voltage to be applied to word lines, which are coupled to the selected memory cells, during an erase verify operation.

3. The method of claim 1, wherein the target erase level is set to be increased by increasing an erase verify voltage to be applied to word lines, which are coupled to the selected memory cells, during an erase verify operation.

4. The method of claim 1, wherein the erase operation is performed using an incremental step pulse erase (ISPE) method.

5. The method of claim 1, further comprising updating the erase-program cycling number after the erase operation is performed.

6. A method of operating a semiconductor memory device, the method comprising:
    checking an erase-program cycling number;
    setting a target erase level to be maintained when the erase-program cycling number is less than a first predetermined critical number, setting the target erase level to be increased by a first level when the erase-program cycling number is between the first predetermined critical number and a second predetermined critical number that is greater than the first predetermined critical number, and setting the target erase level to be increased by a second level that is higher than the first level when the erase-program cycling number is greater than the second predetermined critical number; and
    performing an erase operation so that threshold voltages of selected memory cells are less than the set target erase level.

7. The method of claim 6, wherein the target erase level is set to be maintained by maintaining an erase verify voltage to be applied to word lines, which are coupled to the selected memory cells, during an erase verify operation.

8. The method of claim 6, wherein the target erase level is set to be increased by increasing an erase verify voltage to be applied to word lines, which are coupled to the selected memory cells, during an erase verify operation.

9. The method of claim 6, wherein the erase operation is performed using an incremental step pulse erase (ISPE) method.

10. The method of claim 6, further comprising updating the erase-program cycling number after the erase operation is performed.

11. A semiconductor memory device, comprising:
    a memory cell array including a plurality of cell blocks storing normal data and at least one spare block storing data corresponding to an erase-program cycling number; and
    a peripheral circuit suitable for, when an erase operation is performed on a selected cell block among the cell blocks, setting a target erase level for the erase operation to be maintained before the erase-program cycling number reaches predetermined critical number or to be increased after the erase-program cycling number reaches the predetermined critical number, and for performing the erase operation so that threshold voltages of memory cells within the selected cell block reach the set target erase level.

12. The semiconductor memory device of claim 11, wherein the peripheral circuit includes:
    a voltage generation circuit suitable for generating an erase voltage to be applied to a bulk including the selected cell block and an erase verify voltage, corresponding to the set target erase level, to be applied to word lines within the selected cell block;
    a row circuit suitable for selecting one of the cell blocks and for transferring the erase verify voltage to the word lines within the selected cell block;

a column circuit suitable for performing an erase verify operation on the selected cell block and for reading the data corresponding to the erase-program cycling number from the spare block; and a control circuit suitable for controlling the voltage generation circuit, the row circuit, and the column circuit based on the erase-program cycling number during the erase operation for the selected cell block.

13. The semiconductor memory device of claim 12, wherein the control circuit controls the voltage generation circuit, the row circuit, and the column circuit to increase the erase verify voltage during the erase verify operation after the erase-program cycling number reaches the predetermined critical number.

* * * * *